(12) United States Patent
Grolier et al.

(10) Patent No.: US 8,598,596 B2
(45) Date of Patent: Dec. 3, 2013

(54) METHOD FOR PRODUCING AN OPTOELECTRONIC SEMICONDUCTOR CHIP AND OPTOELECTRONIC SEMICONDUCTOR CHIP

(75) Inventors: Vincent Grolier, München (DE); Lutz Hoeppel, Ateglofsheim (DE); Hans-Jürgen Lugauer, Sinzing (DE); Martin Strassburg, Tegernheim (DE); Andreas Biebersdorf, Regensburg (DE)

(73) Assignee: OSRAM Opto Semiconductors GmbH (DE)

(*) Notice: Subject to any disclaimer, the term of this patent is extended or adjusted under 35 U.S.C. 154(b) by 123 days.

(21) Appl. No.: 13/128,050

(22) PCT Filed: Oct. 12, 2009

(86) PCT No.: PCT/DE2009/001415
§ 371 (c)(1),
(2), (4) Date: Jul. 25, 2011

(87) PCT Pub. No.: WO2010/051786
PCT Pub. Date: May 14, 2010

(65) Prior Publication Data
US 2011/0278641 A1    Nov. 17, 2011

(30) Foreign Application Priority Data
Nov. 7, 2008  (DE) .................. 10 2008 056 371

(51) Int. Cl.
*H01L 21/02*  (2006.01)
(52) U.S. Cl.
USPC ................. 257/77; 257/79; 257/88; 257/94; 257/E21.002; 257/E29.029

(58) Field of Classification Search
USPC ............. 257/12–15, 77, 79, 88–94, E21.002, 257/29.069, 33.023
See application file for complete search history.

(56) References Cited

U.S. PATENT DOCUMENTS

| 5,306,662 | A | 4/1994 | Nakamura et al. |
| 5,874,320 | A | 2/1999 | Shih et al. |

(Continued)

FOREIGN PATENT DOCUMENTS

| DE | 10152922 | 5/2003 |
| DE | 10 2007 019 079 | 4/2007 |

(Continued)

OTHER PUBLICATIONS

Schnitzer, I. et al., "30% external quantum efficiency from surface textured, thin-film light-emitting diodes," *Applied Physics Letters*, Oct. 18, 1993, vol. 63 No. 16, pp. 2174-2176.

(Continued)

*Primary Examiner* — Michael Lebentritt
(74) *Attorney, Agent, or Firm* — DLA Piper LLP (US)

(57) ABSTRACT

An optoelectronic semiconductor chip includes a semiconductor layer sequence having at least one doped functional layer having at least one dopant and at least one codopant, wherein the semiconductor layer sequence includes a semiconductor material having a lattice structure, one selected from the dopant and the codopant is an electron acceptor and the other an electron donor, the codopant is bonded to the semiconductor material and/or arranged at interstitial sites, and the codopant at least partly forms no bonding complexes with the dopant.

20 Claims, 6 Drawing Sheets

(56) References Cited

U.S. PATENT DOCUMENTS

| | | | | |
|---|---|---|---|---|
| 7,791,062 | B2* | 9/2010 | Lee | 257/13 |
| 8,044,380 | B2* | 10/2011 | Lee | 257/13 |
| 8,278,646 | B2* | 10/2012 | Lee | 257/13 |
| 2004/0004225 | A1* | 1/2004 | Sung et al. | 257/90 |
| 2005/0072982 | A1 | 4/2005 | Strauss et al. | |
| 2008/0203407 | A1 | 8/2008 | Ahlstedt et al. | |
| 2009/0302314 | A1 | 12/2009 | Kusumori et al. | |
| 2010/0289002 | A1* | 11/2010 | Lee | 257/13 |

FOREIGN PATENT DOCUMENTS

| | | |
|---|---|---|
| DE | 11 2007 001 605 | 6/2009 |
| JP | 11-126758 | 5/1999 |
| JP | 2001-044209 | 2/2001 |
| JP | 2002-319703 | 10/2002 |
| JP | 2003-218391 | 7/2003 |
| JP | 2004-128189 | 4/2004 |
| JP | 2008-141047 | 6/2008 |
| KR | 2002-0056566 | 7/2002 |
| KR | 100748709 | 8/2007 |

OTHER PUBLICATIONS

Chang, S. et al., "Acceptor activation of Mg-doped GaN by microwave treatment," *Applied Physics Letters*, Jan. 15, 2001, vol. 78, No. 3, pp. 312-313.

Gelhausen, O. et al., "Influence of low-energy electron beam irradiation on defects in activated Mg.-doped GaN," *Applied Physics Letters*, vol. 81, No. 20, pp. 3747-3749, Nov. 11, 2002.

Ma, P. et al., "Enhanced electroluminescence intensity of InGaN/GaN multi-quantum-wells based on Mg-doped GaN annealed in $O_2$," *Applied Physics Letters*, Sep. 11, 2008, vol. 93, No. 10, pp. 102112-1-102112-3.

Xu, D. et al., "Pulsed excimer laser annealing of Mg-doped cubic GaN," *Journal of Crystal Growth*, Jan. 15, 2000, vol. 209, No. 1, pp. 203-207.

Cusco, R. et al., "Local vibrational modes of H complexes in Mg-doped GaN grown by molecular beam epitaxy," *Applied Physics Letters*, Feb. 9, 2004, vol. 84, No. 6, pp. 897-899.

Harima., H. et al., "Local vibrational modes as a probe of activation process in *p*-type GaN," *Applied Physics Letters*, Sep. 6, 1999, vol. 75, No. 10, pp. 1383-1385.

Kaschner, A. et al., "Local vibrational modes in Mg-doped GaN grown by molecular beam epitaxy," *Applied Physics Letters*, May 31, 1999, vol. 74, No. 22, pp. 3281-3283.

Neugebauer, J. et al., "Hydrogen in GaN: Novel Aspects of a Common Impurity," *Physical Review Letters*, Dec. 11, 1995, vol. 75, No. 24, pp. 4452-4455.

Van de Walle, C., "Interactions of hydrogen with native defects in GaN," *Physical Review B*, Oct. 15, 1997, vol. 56, No. 16, pp. 10020-10023.

Zvanut, M. E. et al., "Thermal activation of Mg-doped GaN as monitored by electron paramagnetic resonance spectroscopy," *Journal of Applied Physics*, vol. 95, No. 4, Feb. 15, 2004, pp. 1884-1887.

English Translation of Chinese Second Official Action dated Aug. 26, 2013 (10 pages).

\* cited by examiner

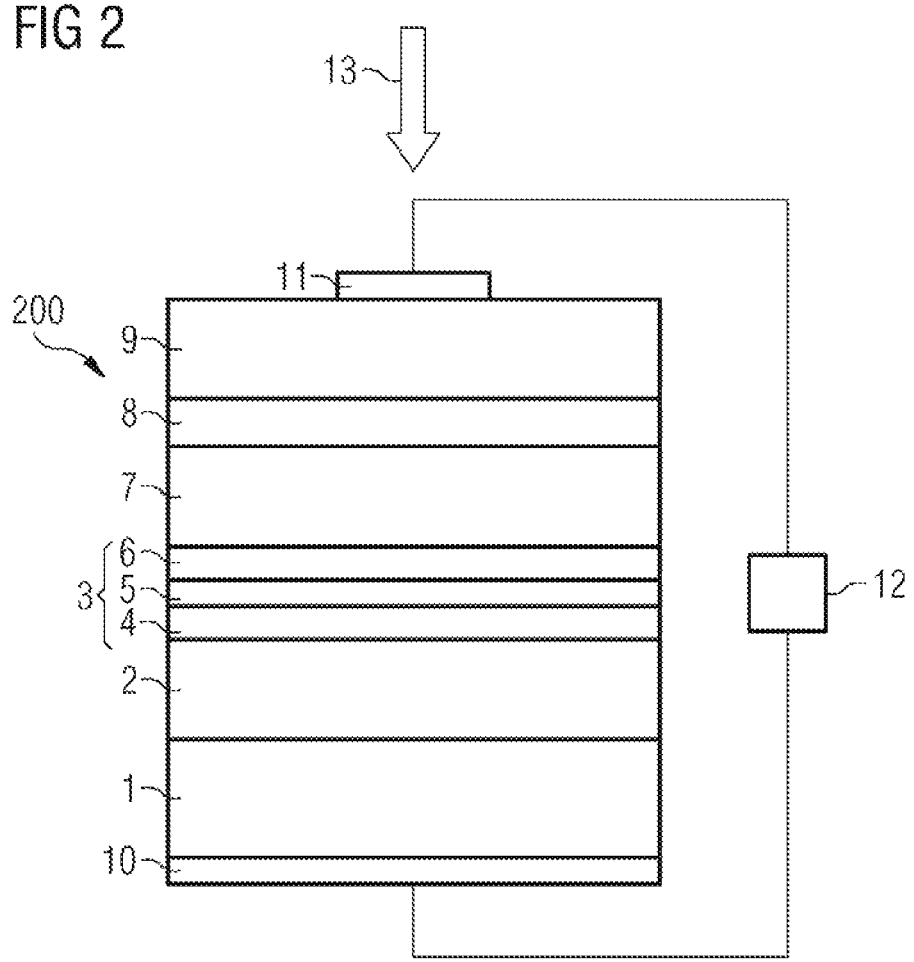

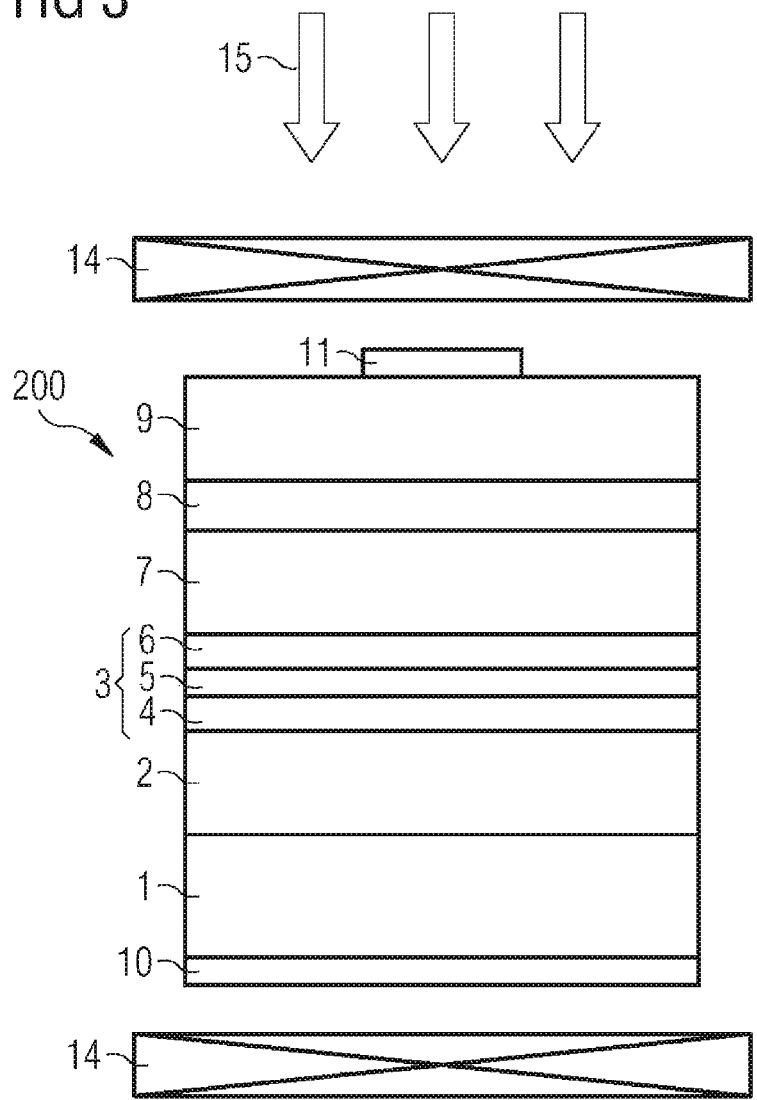

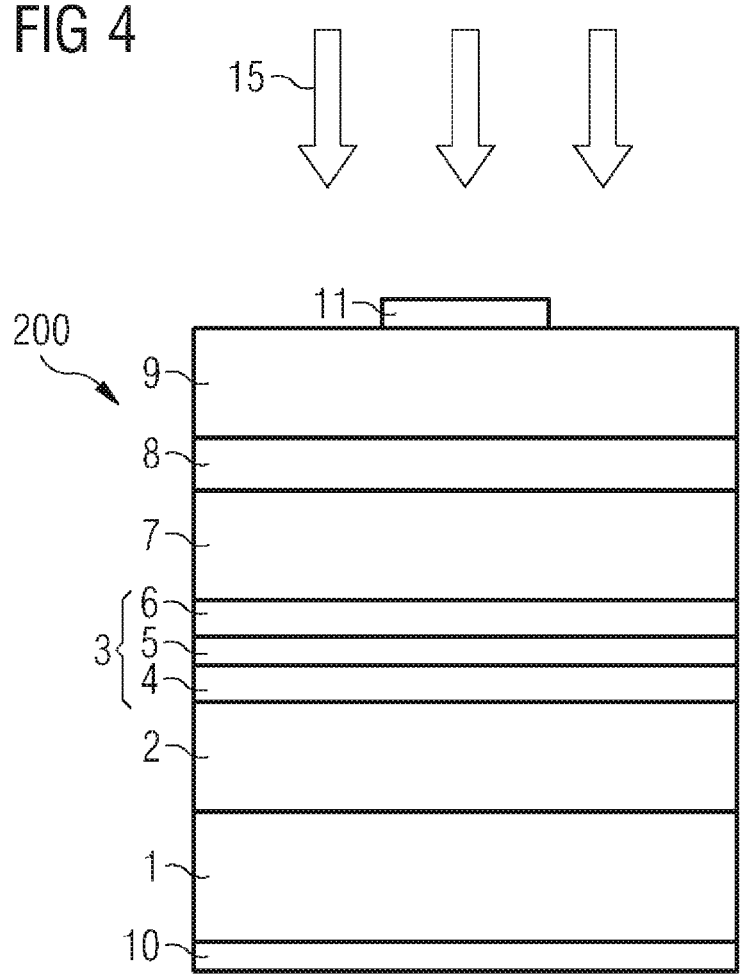

METHOD FOR PRODUCING AN OPTOELECTRONIC SEMICONDUCTOR CHIP AND OPTOELECTRONIC SEMICONDUCTOR CHIP

RELATED APPLICATIONS

This is a §371 of International Application No. PCT/DE2009/001415, with an international filing date of Oct. 12, 2009, which is based on German Patent Application No. 10 2008 056 371.4, filed Nov. 7, 2008, the subject matter of which is incorporated by reference.

TECHNICAL FIELD

This disclosure relates to a method for producing an optoelectronic semiconductor chip as well as an optoelectronic semiconductor chip.

BACKGROUND

During the production of highly doped semiconductor layers that are at the same time of high crystalline quality in semiconductor chips, in the case of many materials, particularly in the case of wide-band semiconductors, a codoping with a second material is necessary alongside the actual doping. By way of example, an electron acceptor material is introduced in the case of a high p-type doping sought to produce an increased charge carrier concentration, that is to say an increased hole concentration. At the same time to counteract a degradation of the crystal quality, an electron donor material is additionally introduced as codoping, as a result of which, however, the electrical neutrality of the crystal is at least partly reestablished. The codoping can thus be undesirable but required by the production method. In the case of layers that are p-doped and simultaneously n-codoped in this way in accordance with the example mentioned, the codoping results, however, in only a low p-type doping or even an intrinsic charge carrier concentration or even an n-type doping. For a high hole concentration for the high p-type conductivity sought in the example mentioned, the compensating effect of the codopant has to be cancelled again, which is referred to as so-called activation of the electrical conductivity, the p-type conductivity in the example given, or as activation of the dopant.

The electrical activation of such codoped semiconductor materials is usually achieved by the activation in the form of a purely thermal annealing step. This requires the codopant to be more readily volatile than the dopant and for the codopant to be able to be driven out from the doped semiconductor layer to a certain degree or completely, that is to say for example from 0.001% to 100%, by the thermal annealing step. This method is necessary for example for the activation of the p-type side of GaN-based light-emitting diodes (LEDs). For this activation there exist established methods for example particularly on the basis of so-called RTP ("rapid thermal processing") processes under specific atmospheres. Conventional activation processes take place at a high temperature of 700 to 1000° C. in the wafer assemblage in the form of RTP processes or else at a lower temperature at 500 to 600° C. in the wafer assemblage in the tube furnace with a comparatively significantly longer duration and a different gas mixture.

The known methods function only inadequately, however, if for any reason the diffusion of the codopant from the doped semiconductor material is prevented, as is the case for example in so-called buried p-doped layers. In this case, there are significant differences in the achievable degree of activation for codoped p-type layers which are exposed, that is to say which lie near a surface of the crystal, and for which the conventional methods described function, and for p-doped layers which are buried below one or more layers, in particular n-doped layers. The latter can be activated only slightly or not at all by the known activation methods. The measurable operating voltage of components, such as of LEDs, for example, is thereby significantly increased.

It could therefore be helpful to provide methods for producing an optoelectronic semiconductor chip which has at least one doped functional layer. It could also be helpful to provide an optoelectronic semiconductor chip.

SUMMARY

We provide a method for producing an optoelectronic semiconductor chip including (A) forming a semiconductor layer sequence having at least one doped functional layer which includes bonding complexes with at least one dopant and at least one codopant, wherein one selected from the dopant and the codopant is an electron acceptor and the other an electron donor, and (B) activating the dopant by breaking open the bonding complexes by introducing energy, wherein the codopant at least partly remains in the semiconductor layer sequence and at least partly forms no bonding complexes with the dopant.

We also provide an optoelectronic semiconductor chip including a semiconductor layer sequence having at least one doped functional layer having at least one dopant and at least one codopant, wherein the semiconductor layer sequence includes a semiconductor material having a lattice structure, one selected from the dopant and the codopant is an electron acceptor and the other an electron donor, the codopant is bonded to the semiconductor material and/or arranged at interstitial sites, and the codopant at least partly forms no bonding complexes with the dopant.

BRIEF DESCRIPTION OF THE DRAWINGS

FIGS. 2 to 4 show schematic illustrations of method steps for producing optoelectronic semiconductor chips in accordance with further examples.

Figure 1A:
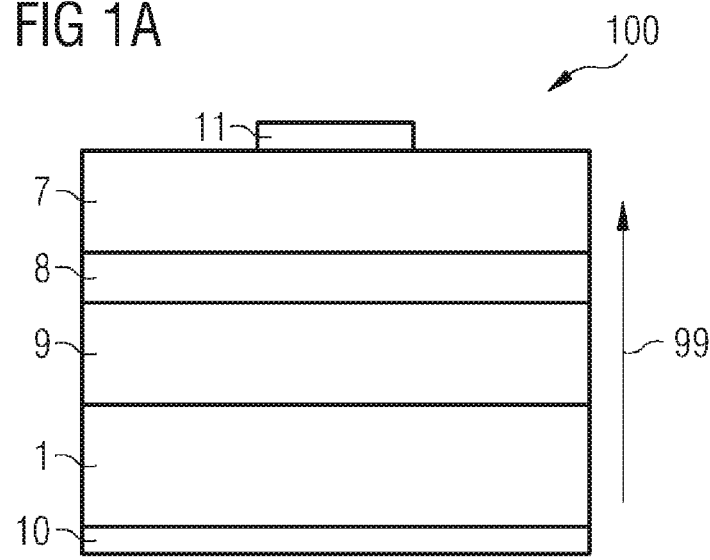
FIGS. 1A to 1D show schematic illustrations of method steps for producing optoelectronic semiconductor chips in accordance with different examples.

We provide a method for producing an optoelectronic semiconductor chip comprising:

A) forming a semiconductor layer sequence having at least one doped functional layer which comprises bonding complexes with at least one dopant and at least one codopant, wherein one selected from the dopant and the codopant is an electron acceptor and the other an electron donor, B) activating the dopant by breaking open bonding complexes by introducing an energy, wherein the codopant at least partly remains in the semiconductor layer sequence and at least partly forms no bonding complexes with the dopant.

The optoelectronic semiconductor chip may comprise, in particular, a semiconductor layer sequence having at least one doped functional layer having a dopant and a codopant, wherein the semiconductor layer sequence comprises a semiconductor material having a lattice structure, one selected from the dopant and the codopant is an electron acceptor and the other an electron donor, the codopant is bonded to the semiconductor material and/or arranged at interstitial sites, and the codopant at least partly forms no bonding complexes with the dopant.

The examples, features and combinations thereof which are described below relate equally to the optoelectronic semiconductor chip and to the method for producing the optoelectronic semiconductor chip, unless explicitly noted otherwise.

Thereby, the fact that one layer or one element is arranged or applied "on" or "above" another layer or another element can mean here and hereinafter that the one layer or the one element is arranged directly in direct mechanical and/or electrical contact on the other layer or the other element. Furthermore, it can also mean that the one layer or the one element is arranged indirectly on or above the other layer or the other element. In this case, further layers and/or elements can then be arranged between the one and the other layer or between the one and the other element.

The fact that one layer or one element is arranged "between" two other layers or elements can mean here and hereinafter that the one layer or the one element is arranged directly in direct mechanical and/or electrical contact or in indirect contact with one of the two other layers or elements and in direct mechanical and/or electrical contact or in indirect contact with the other of the two other layers or elements. In this case, in the case of indirect contact, further layers and/or elements can then be arranged between the one and at least one of the two other layers or between the one and at least one of the two other elements.

In this case, the term "doped functional layer" always denotes a layer having a dopant and a codopant within the meaning described above.

By targeted energy input in method step B, the bonding complexes in the doped functional layer, which are present for example in the form of atomic bonds between the dopant and the codopant or in the form of bonding complexes between the dopant, the codopant and the semiconductor material of the doped functional layer, can be manipulated to the extent that the compensating effect of the codopant on the doping properties of the actual dopant can be cancelled. By suitable process conditions, the method makes it possible to avoid direct reestablishment of these broken bonds or bonding complexes in comparison with conventional methods. In particular, what can be achieved is that the codopant is bonded at a different location, that is to say not at the dopant, in the crystal lattice of the semiconductor material of the doped functional layer or a different layer of the semiconductor layer sequence or is disposed interstitially, where it can no longer have a compensating effect on the dopant. As a result, the number of free, that is to say non-compensated, charge carriers introduced by the dopant increases without the codopant having to be driven out from the doped functional layer or from the semiconductor layer sequence. On account of the higher conductivity that can be achieved in this way, the operating voltage of an optoelectronic semiconductor chip activated in this way also decreases.

The fact that the codopant at least partly forms no bonding complexes with the dopant can mean here and hereinafter, in particular, that at least one part of the codopant which forms no bonding complexes with a part of the dopant is present in the doped functional layer such that the part of the dopant can contribute to increasing the density of free charge carriers in the doped functional layer. In this case, the term "free charge carriers" encompasses in a p-doped layer, in particular, holes, that is to say locations at which electrons are absent and which crucially contribute to the electrical conductivity of p-conducting semiconductors, and electrons in an n-doped layer.

In particular, the optoelectronic semiconductor chip can be produced or embodied as a light-emitting diode (LED) or as a laser diode and have at least one active layer having an active region suitable for emitting electromagnetic radiation. Here and hereinafter "light" or "electromagnetic radiation" can equally mean, in particular, electromagnetic radiation having at least one wavelength or one wavelength range from an infrared to ultraviolet wavelength range of greater than or equal to 200 nm and less than or equal to 20 000 nm. In this case, the light or the electromagnetic radiation can comprise a visible, that is to say a near infrared to blue, wavelength range having one or more wavelengths between approximately 350 nm and approximately 1000 nm.

The semiconductor chip can have as active region in the active layer, for example, a pn junction, a double heterostructure, a single quantum well structure (SQW structures) or a multiple quantum well structure (MQW structures). The designation quantum well structure encompasses, in particular, any structure in which charge carriers can experience a quantization of their energy states as a result of confinement. In particular, the designation quantum well structure does not include any indication about the dimensionality of the quantization. It therefore encompasses, inter alia, quantum wells, quantum wires and quantum dots and any combination of these structures. Alongside the active layer having the active region, the semiconductor layer sequence can comprise further functional layers and functional regions, selected from p- and n-doped charge carrier transport layers, that is to say electron and hole transport layers, p- n- and undoped confinement, cladding and waveguide layers, barrier layers, planarization layers, buffer layers, protective layers and electrodes and also combinations of the layers mentioned. In this case, the electrodes can each comprise one or a plurality of metal layers comprising Ag, Au, Sn, Ti, Pt, Pd, Cr, Al and/or Ni and/or one or a plurality of layers comprising a transparent conductive oxide such as, for instance, zinc oxide, tin oxide, cadmium oxide, titanium oxide, indium oxide or indium tin oxide (ITO). Furthermore, additional layers, for instance buffer layers, barrier layers and/or protective layers, can also be arranged perpendicularly to the arrangement direction of the semiconductor layer sequence around the semiconductor layer sequence, for example, that is to say for instance on the side surfaces of the semiconductor layer sequence.

The semiconductor layer sequence or the semiconductor chip can be an epitaxial layer sequence, that is to say an epitaxially grown semiconductor layer sequence. In this case, the semiconductor chip or the semiconductor layer sequence can be in particular a nitride semiconductor system. The term nitride semiconductor system encompasses all nitride compound semiconductor materials. This can involve a semiconductor structure composed of a binary, ternary and/or quaternary compound comprising elements of main group III with a nitride. Examples of such materials are BN, AlGaN, GaN, InAlGaN or further III-V compounds. In this sense, the semiconductor layer sequence or the semiconductor chip can be embodied on the basis of InAlGaN. InAlGaN-based semiconductor chips and semiconductor layer sequences include, in particular, those in which the epitaxially produced semiconductor layer sequence generally has a layer sequence composed of different individual layers which contains at least one individual layer comprising a material from the III-V compound semiconductor material system $In_xAl_yGa_{1-x-y}N$ where $0 \leq x \leq 1$, $0 \leq y \leq 1$ and $x+y \leq 1$.

Semiconductor layer sequences comprising at least one active layer based on InGaAlN can emit for example preferably electromagnetic radiation in an ultraviolet to green or green-yellow wavelength range.

Furthermore, the semiconductor layer sequence can be for example on the basis of AlGaAs. AlGaAs-based semiconductor chips and semiconductor layer sequences include, in particular, those in which the epitaxially produced semiconductor layer sequence generally has a layer sequence composed of different individual layers which contains at least one individual layer comprising a material from the III-V compound semiconductor material system $Al_xGa_{1-x}As$ where $0 \leq x \leq 1$. In particular, an active layer comprising an AlGaAs-based material can be suitable for emitting electromagnetic radiation having one or more spectral components in a red to infrared wavelength range. Furthermore, such a material can comprise In and/or P in addition or as an alternative to the elements mentioned.

Alternatively or additionally, the semiconductor layer sequence can also be based on InGaAlP, that is to say that the semiconductor layer sequence can have different individual layers, of which at least one individual layer comprises a material from the III-V compound semiconductor material system $In_xAl_yGa_{1-x-y}P$ where $0 \leq x \leq 1$, $0 \leq y \leq 1$ and $x+y \leq 1$. Semiconductor layer sequences or semiconductor chips having at least one active layer based on InGaAlP can emit for example preferably electromagnetic radiation having one or more spectral components in a green to red wavelength range.

Alternatively or additionally, the semiconductor layer sequence or the semiconductor chip can also comprise II-VI compound semiconductor material systems alongside or instead of the III-V compound semiconductor material systems. A II-VI compound semiconductor material can comprise at least one element from the second main group or the second subgroup, such as, for example, Be, Mg, Ca, Sr, Cd, Zn, Sn and an element from the sixth main group, such as, for example, O, S, Se, Te. In particular, a II-VI compound semiconductor material comprises a binary, ternary or quaternary compound comprising at least one element from the second main group or second subgroup and at least one element from the sixth main group. Such a binary, ternary or quaternary compound can additionally comprise for example one or more dopants and additional constituents. By way of example, the II-VI compound semiconductor materials include: ZnO, ZnMgO, CdS, ZnCdS, MgBeO.

All the materials specified previously need not necessarily have a mathematically exact composition according to the formulae specified. Rather, they can comprise one or a plurality of further dopants and additional constituents which substantially do not change the physical properties of the material. For the sake of simplicity, however, the formulae specified only include the essential constituents of the crystal lattice, even if these can be replaced in part by small amounts of further substances.

The semiconductor layer sequence can furthermore have a substrate, on which the abovementioned III-V or II-VI compound semiconductor material systems are deposited. In this case, the substrate can comprise a semiconductor material, for example a compound semiconductor material system mentioned above. By way of example, the substrate can comprise GaP, GaN, SiC, Si and/or Ge or else sapphire or be composed of such a material. The substrate can be a growth substrate, which means that the semiconductor layer sequence is grown epitaxially on the substrate and that the functional layer of the semiconductor layer sequence that is arranged furthest away from the substrate is the layer lying right at the top in the growth direction. As an alternative to this, the substrate can also be a carrier substrate, onto which a semiconductor layer sequence grown beforehand on a growth substrate is transferred by rebonding, for example, in such a way that that layer of the semiconductor layer sequence which lies right at the top in the growth direction on the growth substrate lies closest to the carrier substrate after rebonding. The growth substrate can be partly or wholly removed after the transfer step, such that that layer of the semiconductor layer sequence which is grown first on the growth substrate can be uncovered. In particular, an optoelectronic semiconductor chip comprising a carrier substrate can be a thin-film semiconductor chip.

Thin-film semiconductor chips are distinguished, in particular, by at least one of the following characteristic features:
a reflective layer is applied or formed at a first main area—facing toward a carrier—of a radiation-generating epitaxial layer sequence, the reflective layer reflecting at least part of the electromagnetic radiation generated in the epitaxial layer sequence back into the latter;
the epitaxial layer sequence has a thickness in the range of 20 μm or less, in particular in the region of 10 μm; and
the epitaxial layer sequence contains at least one semiconductor layer having at least one area having an intermixing structure which ideally leads to an approximately ergodic distribution of the radiation in the epitaxial layer sequence, that is to say that it has an as far as possible ergodically stochastic scattering behavior.

A basic principle of a thin-film light-emitting diode chip is described for example in I. Schnitzer et al., *Appl. Phys. Lett.* 63 (16), 18 Oct. 1993, 2174-2176, the subject matter of which is incorporated by reference.

In method step A, as the semiconductor layer sequence, for example, it is possible to provide the doped functional layer in the form of an individual layer or in the form of a doped functional layer stack. Furthermore, the semiconductor layer sequence can be provided or formed as a partly finished part of the semiconductor chip. That can mean, for example, that the semiconductor layer sequence has a substrate, for instance a growth substrate, on which a plurality of functional layers including the doped functional layer having the dopant and the codopant are grown as a layer lying right at the top in the growth direction. Alternatively, the substrate can be a carrier substrate, onto which a semiconductor layer sequence having a doped functional layer is transferred, and the growth substrate is subsequently removed, such that the doped functional layer is uncovered.

Furthermore, in method step A, the semiconductor layer sequence can be formed with a plurality of functional layers, wherein the doped functional layer having the dopant and the codopant is arranged between two further functional layers, such that the doped functional layer is not formed as a layer lying right at the top of the semiconductor layer sequence. If one or a plurality of further functional layers are in each case arranged above and below the doped functional layer in the growth direction, wherein at least the layers directly adjacent to the doped functional layer are different from the doped functional layer, in particular differently doped, then the doped functional layer here and hereinafter can also be referred to as a so-called "buried" layer.

In particular, the semiconductor chip can already be completed in the method step A, which means that after method step A the semiconductor layer sequence already has all the functional layers of the semiconductor layer sequence which are required for the operation of the semiconductor chip. In this case, the semiconductor layer sequence can be embodied in a wafer assemblage, for example. In this case, the semiconductor layer sequence completed in this way can be formed and provided in the wafer assemblage or furthermore in a manner already singulated in a manner corresponding to individual semiconductor chips after method step A has been performed.

The semiconductor chip or the semiconductor layer sequence can have an active region for example between a p-doped layer and an n-doped layer succeeding the latter in the growth direction, such that the polarity as seen in the growth direction is inverted by comparison with a conventional semiconductor chip, in which the p-doped region succeeds the n-doped region in the growth direction. Depending on the embodiment of the semiconductor chip with a growth substrate or a carrier substrate, the n-doped layer or else the p-doped layer can be embodied as the buried doped functional layer.

A buried doped functional layer can furthermore be for example an optoelectronic semiconductor chip with at least one tunnel junction having at least one n-doped ("n-type") tunnel junction layer and at least one p-doped ("p-type") tunnel junction layer. In this case, the at least one doped functional layer having the dopant and the codopant can be formed by the at least one n-doped tunnel junction layer or by the at least one p-doped tunnel junction layer. In this case, an active layer having an active region can be disposed downstream of the tunnel junction within the semiconductor layer sequence in a direction facing away from a substrate. In this case, an undoped region composed of at least one undoped intermediate layer can be arranged between the at least one n-type tunnel junction layer and the at least one p-type tunnel junction layer, such that the n-type tunnel junction layer and the p-type tunnel junction layer do not directly adjoin one another, but rather are separated from one another by at least one undoped intermediate layer. In this case, the term "tunnel junction layer" is used for differentiation from the remaining functional layers of the semiconductor layer sequence or of the semiconductor chip and means that the n-type tunnel junction layer or p-type tunnel junction layer thus designated is arranged in the tunnel junction.

By virtue of the fact that the n-type tunnel junction layer and the p-type tunnel junction layer are separated from one another by the undoped region, a disadvantageous compensation of the different charge carriers at the interface is prevented, which would otherwise occur on account of the diffusion of charge carriers via the interface if the p-type tunnel junction layer and the n-type tunnel junction layer directly adjoined one another. Although the insertion of the undoped region between the n-type tunnel junction layer and the p-type tunnel junction layer also produces a region having only a low charge carrier density within the tunnel junction, what can also be achieved is that this undoped region inserted in the form of one or a plurality of undoped intermediate layers affects the electrical properties of the tunnel junction, in particular the forward voltage, less disadvantageously than a region at the interface between an n-type tunnel junction layer and a directly adjoining p-type tunnel junction layer in which charge carriers mutually compensate for one another on account of the diffusion via the interface.

Furthermore, the semiconductor layer sequence or the semiconductor chip can be a stacked LED having a plurality of active layers grown one above another, wherein each of the active layers is respectively arranged between at least one n-doped layer and one p-doped layer, also in combination for example with tunnel junction layers. As a result, a semiconductor layer sequence embodied as a stacked LED can have at least one buried doped functional layer.

The previously described structures for the semiconductor layer sequence or the semiconductor chip in the form of regular or inverted polarities, tunnel junction layers and stacked active regions are known and will not be further explained. What is common to all these structures is that they can have buried doped functional layers which can have a dopant and a codopant and which are adjacent to layers which can act as diffusion barriers for the codopant. In the case of such buried doped functional layers, therefore, in conventional activation of the dopant for example by a conventional RTP method described above may be hardly possible or not possible at all.

The dopant for a p-doped functional layer, that is to say at least one suitable electron acceptor, at least in the case of high doping intensities to be achieved, generally cannot be introduced in a pure form into the semiconductor material of the doped functional layer. Instead, the dopant is present in a complex with at least one further substance, the codopant. The further substance often acts as an electron donor for the semiconductor material, which compensates for the electron acceptor material, that is to say the dopant, in terms of its electrical effect. In particular, the doped functional layer can therefore be a p-doped layer in which the dopant comprises or is an electron acceptor material, while the codopant comprises or is an electron donor material. The activation step in accordance with method step B is suitable for permanently producing the electrical effect of at least part of the dopant within the semiconductor material, that is to say that it is suitable for increasing the p-type conductivity.

Particularly preferably, the dopant in a wide-band semiconductor system such as, for instance, in a nitride compound semiconductor system for a p-doped functional layer comprises magnesium or is magnesium. The magnesium is generally incorporated into the semiconductor material in a complex with hydrogen as codopant. The activation step in accordance with method step B produces the electrical effect of at least part of the magnesium as p-type dopant, which is compensated for by the hydrogen. In a II-VI compound semiconductor system such as ZnSe, for instance, the dopant for example comprises nitrogen or is nitrogen. The codopant can preferably be hydrogen in this case as well.

Alternatively, the doped functional layer can also be an n-doped layer, that is to say that the dopant is electron donor material, while the codopant is an electron acceptor material. This can for example be particularly suitable for semiconductor materials having a relatively small band gap, for instance compound semiconductor materials based on CdTe or GaAs.

Since the drive-out of the codopant is not necessary in the method described here, it is suitable, in particular, for doped functional layers from which the codopant cannot outdiffuse for fundamental reasons, for instance because the doped functional layer is a buried layer in the above sense. The method described here can therefore for the first time afford the possibility of activating these layers as well. For above-described PILS ("polarity inverted LED structures") and stacked LEDs, for instance based on GaN or other compound semiconductor materials from those mentioned above, this type of activation is essential since, in these cases, a p-doped functional layer, for example comprising Mg as dopant and hydrogen as codopant, cannot be activated by an RTP-based heat treatment step aimed exclusively at driving out the codopant.

To achieve a targeted and as far as possible permanent breaking-open of the bonding—which is passivating for the dopant—of the codopant to the dopant or else to crystal atoms, it is necessary for energy to be supplied and introduced. In this case, in method step B, the energy can be introduced by generating a current in the doped functional layer. Here and hereinafter, this can also be referred to as so-called "electrical activation". During the electrical activation, at least the doped functional layer can be electrically connected to an external current source. Furthermore, by way of example, an optoelectronic semiconductor chip that has already been fully produced and formed with regard to the semiconductor layer sequence in method step A can be electrically operated for a specific time period, that is to say connected to an external current and voltage source. In this case, the optoelectronic semiconductor chip can still be situated in the wafer assemblage, such that a plurality of optoelectronic semiconductor chips or semiconductor layer sequences can be activated simultaneously. As an alternative thereto, the semiconductor chip can already have been singulated in method step A and hence detached from the wafer assemblage, such that the semiconductor chip can be activated individually and independently of further semiconductor chips of the wafer assemblage. With regard to the required current densities described below, an electrical activation of a singulated semiconductor layer sequence or of a singulated optoelectronic semiconductor chip can be advantageous since a scaling of this method to larger wafer slices may be possible technologically only to a limited extent.

As an alternative thereto, the current can be generated contactlessly by induction by an external suitable coil arrangement. In this case, in a plane parallel to the extension plane of the doped functional layer, at least in the doped functional layer or additionally also in further layers of the semiconductor layer sequence, a circulating current or a plurality of circulating currents can be generated in a manner directed perpendicularly to the growth direction of the semiconductor layer sequence and thus perpendicularly to the operationally governed current direction of the semiconductor chip.

If, in method step A, the semiconductor layer sequence is formed for example on an electrically insulating sapphire substrate as growth substrate, the electrical activation can take place by electrical connection after the rebonding of the semiconductor layer sequence onto an electrically conductive carrier substrate and after the removal of the growth substrate. As an alternative or in addition thereto, the electrical activation can already be carried out by induction before a rebonding step, which is possibly no longer necessary.

During electrical activation, both by electrical connection and induction, it is possible to observe a continuous decrease in the necessary operating voltage to a minimum value, which remains permanently. In this case, the current density generated can be greater than or equal to $50\,A/cm^2$, wherein higher current densities can accelerate the activation.

Furthermore, particularly preferably, in addition to generating the current, it is possible to supply a thermal energy, such that the temperature of the semiconductor layer sequence or of the optoelectronic semiconductor chip, but at least the temperature of the doped functional layer, is increased. The temperature of the doped functional layer should be greater than or equal to approximately 80° C. and particularly preferably greater than or equal to 100° C. Furthermore, the current density generated in the case of such temperatures can be greater than or equal to $10\,A/cm^2$. In comparison with known activation methods, the temperature in the case of the activation methods described here can be less than or equal to 400° C. and furthermore less than or equal to 300° C. With increasingly higher temperatures, the activation can be accelerated virtually exponentially, which can simultaneously enable lower necessary current densities. It has been ascertained by measurements that at approximately 300° C., for example, a saturation in the decrease in the operating voltage can be established as early as after approximately one minute. The activation time has to be chosen very precisely, that is to say, in particular, such that it is not too long, since otherwise an additional decrease in light emission can be established as a result of ageing of the semiconductor layer sequence. However, there is a parameter space within which ageing commences significantly later and proceeds more slowly than the saturation at a reduced level of the operating voltage takes place. In particular, the activation time both during the electrical activation and during the alternative and additional activation processes described below can last for less than or equal to 10 minutes, and particularly preferably less than or equal to 5 minutes.

The thermal energy can be supplied by an external heat source, that is to say a heating system, for instance. Alternatively or additionally, the thermal energy can also be supplied by the generated current itself on account of ohmic losses. As a result of the influence of the increased temperature generated by the thermal energy introduced in combination with the current flow generated, the codopant, that is to say the abovementioned hydrogen, for example, can be rearranged in such a way that the actual dopant, that is to say the abovementioned magnesium, for example, is activated.

As an alternative or in addition to generating a current and/or introducing a thermal energy, in method step B an energy can be introduced by an electromagnetic radiation being radiated in. Here and hereinafter this can also be referred to as "electromagnetic activation". An electromagnetic activation can mean that the semiconductor layer sequence formed in method step A can be irradiated with electromagnetic radiation which is resonant or non-resonant with absorption wavelengths or absorption bands of the doped functional layers and/or further layers of the semiconductor layer sequence.

As a result of an electromagnetic radiation being radiated in, it may be possible, for example, for additional charge carriers to be generated which, in conjunction with the electrical activation mentioned above, enable a larger induced current. This may, in particular, also be advantageous when, for example, intrinsically only very few or no free charge carriers are present in the doped functional layer. Furthermore, in the case of resonant irradiation, charge carriers can be excited in a targeted manner in the layers in which the activation is intended to take place, that is to say, for instance, in the doped functional layer. Furthermore, the activation of the doped functional layer can be effected solely by electromagnetic activation.

In this case, the frequency of the electromagnetic radiation that is radiated in determines the type of electromagnetic activation. With the use of microwave radiation, that is to say electromagnetic radiation having a wavelength of greater than or equal to approximately 1 millimeter and less than or equal to approximately 1 meter or a frequency of approximately 300 MHz to approximately 300 GHz, the activation generally takes place in a non-resonant fashion in the case of typical semiconductor materials. In this case, the energy transfer to atomic bonds can be effected, inter alia, by excitations of rotons and/or phonons. In this case, in the doped functional layer, phonons can typically have excitation energies of a few 10 meV, and rotons can have typical excitation energies of less than 1 meV up to a few millielectronvolts. In this case, rotons can encompass inherent rotations of atoms and also of complexes such as excitons, for instance. With the use of so-called terahertz radiation, that is to say electromagnetic radiation having a wavelength of greater than or equal to approximately 100 micrometers and less than or equal to approximately 1 millimeter or a frequency of approximately 300 GHz to approximately 3 THz, a resonant activation in which lattice vibrations, that is to say phonons, can be generated directly is generally involved in the case of customary semiconductor materials.

The process conditions such as, for instance, frequency, power, atmosphere, time, additional susceptors which can absorb the electromagnetic radiation define the degree and success of the electromagnetic activation. In particular, the electromagnetic activation can also be effected by a mixture of resonant and non-resonant activation. By way of example, for a buried doped functional layer composed of p-GaN, the frequency of the electromagnetic radiation that is radiated in can lie between 5 and 10 GHz at a power of 100 to 4000 watts. In this case, the radiation can be introduced preferably over a time period of 10 seconds to one hour. To avoid so-called "hot spots" and so-called "arcing", that is to say local overheating and flashovers, the frequency can also be varied. Furthermore, additionally or alternatively, the semiconductor layer sequence can be rotated and/or translated relative to the device for radiating in the electromagnetic radiation, or vice versa.

Activation by electromagnetic radiation affords the additional advantage of being able to be employed everywhere in the chip cycle. In conventional thermal activation, the activation step is always one of the first processing steps in the context of a chip cycle, since, as described above, a very high temperature, for example above 700° C., is typically required for this; these high temperatures generally damage many of the "subsequent components" or "subsequent layers" which are applied to the semiconductor layer sequence progressively within method step A in a chip cycle. A targeted coupling of the electromagnetic radiation to the material used, for example a doped functional layer composed of p-GaN, makes it possible, by contrast, to integrate this process step into the process cycle at a later point in time since the wave properties of the electromagnetic radiation can precisely be set in such a way that the activation energy couples in highly selectively precisely where, and virtually only where, it is "needed", namely for example into the dopant-codopant or dopant-codopant-semiconductor crystal bonding complexes to be activated. This allows more freedom in the design and in the so-called chip flow for example with regard to the possible order of the individual processes. Furthermore, the activation efficiency can be increased, for example by carrying out the activation after the mesa etching, that is to say at a point in time at which a larger open crystal area is present as a result of the mesas produced and the codopant can thus be transported away better.

In this case, the semiconductor layer sequence or the optoelectronic semiconductor chip formed in method step A can also have a plurality, meaning at least two, of doped functional layers arranged directly adjacent to one another or a plurality of doped functional layers between which further functional layers are arranged. The activation of the plurality of doped functional layers can be effected simultaneously in method step B. As an alternative thereto, each of the doped functional layers can be activated in a method step B respectively adapted with regard to the abovementioned parameters for activation.

The detection of a change in the local bonding states of the codopant can be effected or performed in various ways. One particular sensitive method is spin resonance, as described for example in Zvanut et al., *APL* 95, 1884 (2004), the subject matter of which is incorporated by reference. A changed bonding of the codopant effectively results in a changed g-factor of a charge carrier to be considered in the vicinity of this bonding, wherein the g-factor denotes the so-called gyromagnetic factor or the so-called Landé factor. The changed g-factor is manifested in a changed resonant frequency.

Furthermore, the bonding states of the codopant can also be detected directly by way of their characteristic vibration frequency in the crystal lattice. Thus, by way of example, Mg—H and N—H bonds in the GaN, depending on their position and bonding states in the crystal lattice, have vibration modes having energies of between 2000 and 4000 wave numbers which can be detected by raman spectroscopy and infrared (Fourier) spectroscopy, as described for instance in Neugebauer and van de Walle, *PRL* 75, 4452 (1995), Van de Walle, *Phys. Rev. B* 56, 10020 (1997), Kaschner et al., *APL* 74, 328 (1999), Harima et al., *APL* 75, 1383, (1999) and Cusco et al., *APL* 84, 897 (2004), the subject matter of all of which is incorporated by reference.

Further advantages and developments of this disclosure will become apparent from the examples described below in conjunction with FIGS. 1A to 5.

In the examples and figures, identical or identically acting constituent parts can in each case be provided with the same reference symbols. The elements illustrated and their size relationships among one another should not be regarded as true to scale, in principle; rather, individual elements such as, for example, layers, structural parts, components and regions may be illustrated with exaggerated thickness or size dimensions to enable better illustration and/or to afford a better understanding.

FIGS. 1A to 1D show different examples for method steps A for producing optoelectronic semiconductor chips. In this case, in accordance with each of FIGS. 1A to 1D, a semiconductor layer sequence 100, 200, 300 and 400, respectively, is formed, having at least a substrate 1, a doped functional layer 7, an active region 8 and a further functional layer 9. To make electrical contact, on a side of the substrate 1 which is remote from the doped functional layer 7 and on a surface of the respective semiconductor layer sequence 100, 200, 300, 400 which is remote from the substrate 1, electrode layers 10, 11 are applied, which can comprise one or a plurality of metals and/or one or a plurality of transparent conductive oxides as described in the general part. In this case, purely by way of example, the semiconductor layer sequences of the examples shown are nitride compound semiconductor layer sequences. As an alternative or in addition thereto, the semiconductor layer sequences can also comprise other compound semiconductor materials described in the general part.

Furthermore, hereinafter with regard to the semiconductor chip respectively to be produced, purely by way of example, already completed semiconductor layer sequences 100, 200, 300, 400 are formed, that is to say semiconductor layer sequences which already correspond to the finished semiconductor chip with regard to their respective layer construction. As an alternative thereto, it is also possible for only partly completed semiconductor layer sequences to be formed in method step A, the sequences having at least the doped functional layer 7. Furthermore, in method step A, the semiconductor layer sequences can be formed and provided whilst still in a wafer assemblage before a singulation step that is to be carried out subsequently.

The following description is restricted purely by way of example to a doped functional layer 7 that is p-doped, and to further functional layers that are then correspondingly embodied in n- or p-conducting fashion. As an alternative thereto, the polarities of the doped functional layer 7 and also of the further functional layers or the polarities of their dopants and, if appropriate, their codopants can also be inverted, that is to say that, inter alia, the doped functional layer 7 is formed in an n-doped fashion.

The substrate 1 of the semiconductor layer sequence 100 in accordance with the example in FIG. 1A is a growth substrate on which the overlying layers 7, 8, 9 are grown epitaxially in the context of method step A. The growth direction is identified by the arrow 99 in FIG. 1A and also in the following FIGS. 1B to 1D.

In this example, an n-conducting substrate preferably serves as the growth substrate. In this case, possible n-conducting substrates are, for example, n-GaN, n-SiC, n-Si (111). However, it is also possible for an electrically nonconductive substrate such as sapphire, for example, to be used, in which case the electrode layer 10 is then arranged on that side of the substrate 1 which faces the layers 7, 8, 9.

The functional layer 9 is an n-conducting layer, which, in the example shown, is a gallium nitride layer doped with silicon. The active layer 8 is grown above the functional layer 9, the active layer having, as active region, a single or multiple quantum well structure provided for generating radiation. The active layer 8 is preferably based on the III-V semiconductor material system $In_yGa_{1-y}N$ where $0 \leq y \leq 1$ with alternately arranged optically active layers and barrier layers. Preferably, the active layer 8 is suitable for generating electromagnetic radiation in the ultraviolet, blue, blue-green, yellow or red spectral range, wherein the wavelength of the electromagnetic radiation emitted can be set by the composition and construction of the active layer 8. The indium concentration in the active layer is preferably between 10 and 60 percent.

The doped functional layer 7 is grown epitaxially on the active layer 8, and it comprises GaN or AlGaN as semiconductor material and also as dopant magnesium for the p-type doping and furthermore hydrogen as codopant, to counteract a degradation of the crystal quality of the semiconductor material for instance as a result of the incorporation of intrinsic defects on account of the incorporation of the dopant during crystal growth. The dopant and the codopant form bonding complexes, as a result of which the free charge carriers actually generated by the dopant are compensated for and the electrical neutrality of the semiconductor crystal is at least partly reestablished.

The construction of the semiconductor layer sequence 100 corresponds to a conventional light-emitting diode (LED) with regard to the arrangement of the n-conducting functional layer 9 between the substrate 1 and the active layer 8 and also the p-conducting doped functional layer 7 formed on the active layer 8 in the growth direction 99 and can have even further functional layers such as, for instance, buffer, barrier and/or diffusion barrier layers, which are not shown, however, for the sake of clarity.

Figure 1B:
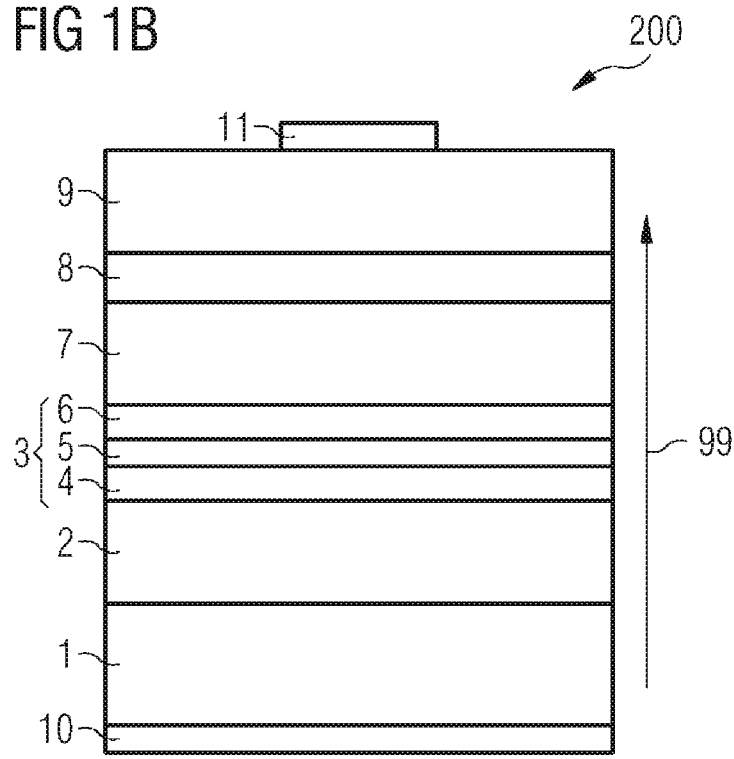

The semiconductor layer sequence 200 in accordance with the further example in FIG. 1B has an inverted polarity in comparison with the semiconductor layer sequence 100, wherein the p-conducting doped functional layer 7 is formed between the growth substrate 1 and the active layer 8 and the n-conducting further functional layer 9 is formed on the active layer 8 in the growth direction 99. In this case, the respective layer composition of the layers 7, 8 and 9 corresponds to the previous example.

Furthermore, the semiconductor layer sequence 200 has an n-conducting further functional layer 2 composed of silicon-doped GaN between the substrate 1, which is an n-conducting growth substrate as in the previous example, and the p-conducting doped functional layer 7. For the effective electrical connection of the p-conducting doped functional layer 7 to the n-conducting further functional layer 2, between these there is formed a tunnel junction 3 having a highly doped n-conducting tunnel junction layer 4, a diffusion barrier layer 5 and a highly doped p-conducting tunnel junction layer 6. In this case, the tunnel junction 3 is described in the general part, wherein the p-conducting tunnel junction layer 6, like the p-conducting doped functional layer 7, comprises magnesium as dopant and hydrogen as codopant. Therefore, the highly doped p-conducting tunnel junction layer 6, like the doped functional layer 7, is also formed as a doped functional layer to be activated within the meaning of the present description.

In contrast to the semiconductor layer sequence 100 in the example in accordance with FIG. 1A, the doped functional layers 6 and 7 in the semiconductor layer sequence 200 are so-called buried doped functional layers arranged between further functional semiconductor layers. Activation of the layers 6 and 7 by a known activation method by driving out the codopant is therefore not possible for the semiconductor layer sequence 200.

The semiconductor layer sequence 200 can have further functional layers (not shown) such as, for instance, a buffer layer between the substrate 1 and the functional layer 2 and/or a diffusion barrier layer between the doped functional layer 7 and the active layer 8.

Figure 1C:
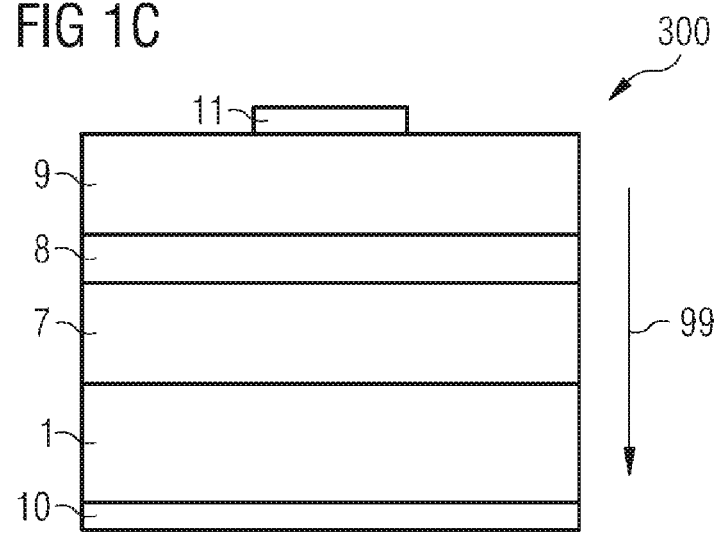

FIG. 1C shows a semiconductor layer sequence 300 as a thin-film semiconductor chip, this sequence likewise having a buried doped functional layer 7. In this case, the layers 7, 8 and 9 correspond to the layers 7, 8 and 9 in FIG. 1A, these layers, after growth on a growth substrate, for example composed of sapphire, having been transferred to a carrier substrate 1 by rebonding, for which reason the growth direction 99 points in the direction of the carrier substrate 1. The growth substrate was removed after rebonding. The semiconductor layer sequence 300 can have further functional layers, for example a reflective layer between the carrier substrate 1 and the p-conducting doped functional layer 7, and/or further features of thin-film semiconductor chips as described in the general part. As a result of the rebonding, the doped functional layer 7 is likewise present as a buried layer, which cannot be activated after rebonding by known activation methods based on driving out the codopant. In the case of the known activation methods, the activation would preferably have had to have been carried out at that point in time before rebonding at which the doped functional layer 7 was still uncovered.

As an alternative to the thin-film semiconductor chip on a carrier substrate, the layer order of the layers 7, 8 and 9 with the doped functional layer 7 between the substrate 1 and the active layer 8 can also be formed by epitaxial growth on a p-conducting growth substrate. In this case, the p-conducting substrate can be composed, for example, of p-GaN, p-SiC or p-Si (111), in which case the growth direction 99 would then be directed away from the substrate 1.

Figure 1D:
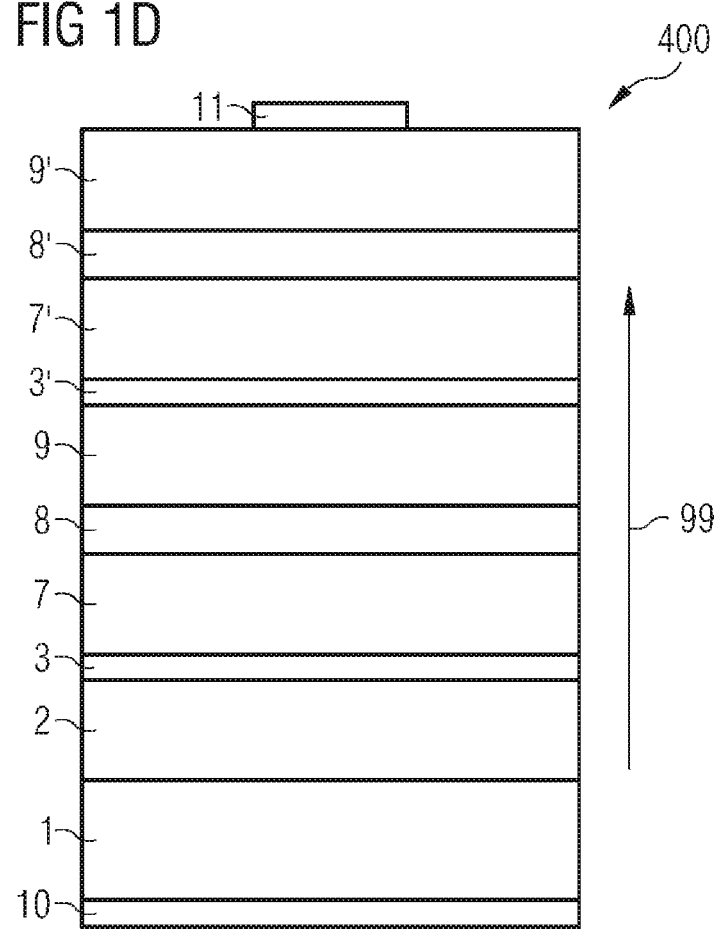

FIG. 1D shows a semiconductor layer sequence 400 having an inverted construction in accordance with FIG. 1B, which construction is furthermore embodied as a stacked construction having a further active layer 8'. In this case, the doped functional layer 7' corresponds to the doped functional layer 7. The further functional layers 3' and 9' correspond to the layers 3 and 9, wherein the tunnel junction 3', like the tunnel junction 3, has the tunnel junction layers 4, 6 and the diffusion barrier layer 5 (not shown) as described in conjunction with FIG. 1B.

In the case of the activation methods described previously in the general part and hereinafter in accordance with the examples, in the further method step B, the point in time in the production process at which the activation in accordance with method step B is carried out is independent of the embodiment and the production process of the respective semiconductor layer sequence. Purely by way of example, the examples for method step B are shown on the basis of the semiconductor layer sequence 200 in accordance with FIG. 1B.

In method step B in accordance with the example in FIG. 2, the doped functional layer 7 and also the highly doped p-conducting tunnel junction layer 6 are activated by energy being introduced in the form of electrical energy. For this purpose, the semiconductor layer sequence 200 is connected to an external current and voltage supply 12. In this case, in the example shown, a current density of approximately 50 A/cm² is generated in the semiconductor layer sequence 200 or, in particular, in the doped functional layer 7 and in the highly doped p-conducting tunnel junction layer 6. Furthermore, the semiconductor layer sequence 200 is brought to a temperature above the customary ambient and operating temperature by thermal energy 13 being supplied. In the example shown, the semiconductor layer sequence 200 is heated to a temperature of at least 80° C. for this purpose by an external heating system (not shown). At least part of the thermal energy supplied can also be brought about by ohmic losses of the impressed current.

Figure 5:
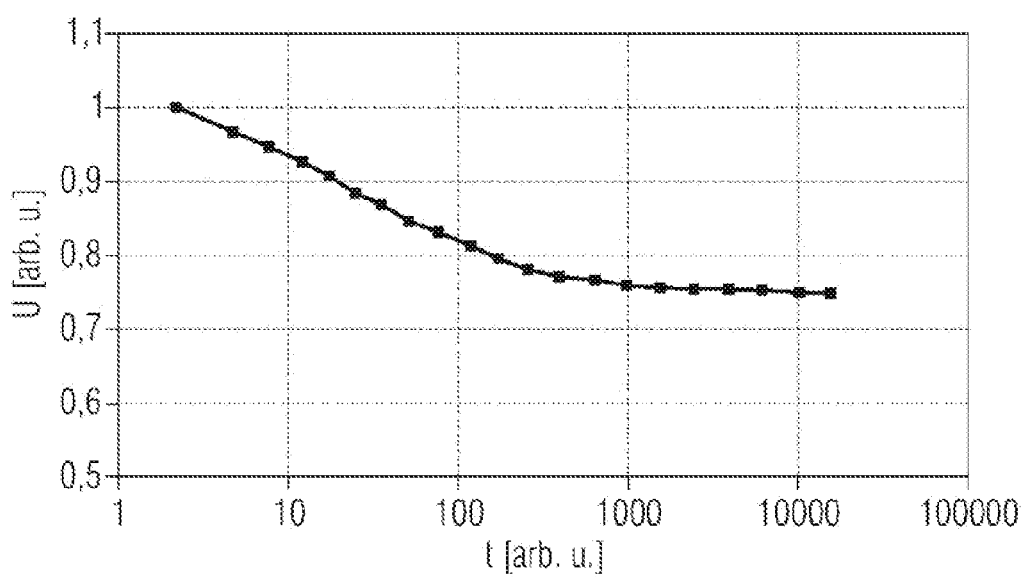
FIG. 5 shows a measurement of the operating voltage as a function of the activation time.

In this case, it has been found experimentally that the required operating voltage provided by the current and voltage supply 12 for operating the semiconductor layer sequence 200 under the abovementioned conditions decreases continuously with time and attains a saturation value, which remains permanently. That means that the current-voltage characteristic of the semiconductor layer sequence can be improved by method step B and can be permanently maintained after method step B. FIG. 5 shows a measurement of the operating voltage U (in arbitrary units) to be applied for a specific operating current as a function of the activation time t (in arbitrary units) of the electrical activation. It has furthermore been ascertained that an increase in the current density and/or the temperature can bring about an acceleration of the voltage drop and the attainment of saturation.

By the abovementioned activation operation of the semiconductor layer sequence 200, it is possible to break open the dopant-codopant and the dopant-codopant-semiconductor crystal bonding complexes that formed during the production of the semiconductor layer sequence 200 in method step A in the layers 6 and 7. In addition, in comparison with conventional activation methods, what can be achieved is that at least part of the codopant is bonded at other locations, that is to say, not in a manner forming a bonding complex at the dopant, in the semiconductor crystal of the layers 6 and 7 or is disposed interstitially. As a result, in the case of the electrical activation shown here, it is not necessary for the codopant at least partly to be driven out from the semiconductor layer sequence, as is absolutely necessary in the case of the known purely thermal activation methods.

On account of the abovementioned current density that is advantageous for method step B, the electrical activation shown by current being impressed by the external current and voltage supply 12 is particularly suitable for already singulated semiconductor layer sequences having at least one buried doped functional layer 7, in which sequences a conventional activation method is technically hardly feasible or not feasible at all. In addition, the application of method step B shown here to semiconductor layer sequences in the wafer assemblage is in no way ruled out.

Method step B in accordance with the example in FIG. 3 is suitable in particular for semiconductor layer sequences in the wafer assemblage but also for already singulated semiconductor layer sequences. In this case, by a device 14 through induction, a current is generated in the semiconductor layer sequence 200 or at least in the doped functional layer 7 and the highly doped p-conducting tunnel junction layer 6 that is likewise to be activated and energy for breaking open the bonding complexes with the dopant and the codopant is thus supplied. In this case, in the example shown, the induction device 14 is realized by coils purely by way of example, wherein here any device which can bring about a sufficient induced current in the semiconductor layer sequence 200 can be suitable.

The device 14 induces circulating currents by the free charge carriers in the layers 6 and 7, and the activation effect described above in conjunction with FIG. 2 can be achieved by the circulating currents. In this case, the circulating currents are generated perpendicularly to the growth direction 99 and parallel to the extension plane of the functional layers of the semiconductor layer sequence 200. In addition, the semiconductor layer sequence 200 can also be supplied with thermal energy in the form of an external heating system (not shown) and/or as a result of ohmic losses of the circulating currents.

Furthermore, in the example shown in accordance with FIG. 3, the semiconductor layer sequence 200 is irradiated with electromagnetic radiation 15 which are resonant or non-resonant with the absorption wavelengths of the functional layers and, in particular, of the layers 6 and 7 to be activated. As a result of the electromagnetic radiation 15 being radiated in, additional free charge carriers are generated which enable a higher current intensity of the induced circulating currents. This is particularly advantageous if intrinsically after method step A only very few or no free charge carriers are present in the layers 6 and 7 to be activated. Particularly in the case of resonant irradiation, further free charge carriers can be excited in a targeted manner in the layers 6 and 7 to be activated, as a result of which the efficiency of the activation can be increased.

As is shown in FIG. 4 in accordance with a further example for method step B, the activation, that is to say the breaking-open of the complexes with the dopant and the codopant, can also be effected only by supplying energy in the form of electromagnetic radiation 15. In this case, the frequency of the electromagnetic radiation 15 determines the type of activation. When microwave radiation is used, the electromagnetic activation is effected in non-resonant fashion, and when terahertz radiation is used, a resonant electromagnetic activation is involved. The process conditions such as frequency, power, atmosphere, time and/or additional absorption centers for the electromagnetic radiation 15 define the degree and success of the activation. In the non-resonant case, energy is transferred to atomic bonds by excitations of phonons and rotons, inter alia. In the resonant case, lattice vibrations, that is to say phonons, are generated directly which can break open the bonding complexes with the dopant and the codopant.

The method steps B in accordance with FIGS. 3 and 4 can advantageously be used everywhere within the process for producing the semiconductor chips in the context of a chip cycle at the wafer level or else after singulation, since they are effected contactlessly and, like method step B in accordance with the example in FIG. 2 as well, do not require an exposed doped functional layer 7 to be activated. This allows more freedom in the design and in the so-called chip flow with regard to the possible order of the individual processes. Furthermore, the activation efficiency can be increased, for example, by the activation being carried out after etching of mesas, such that a larger open semiconductor crystal surface is present and at least part of the codopant can thus also be transported away.

The examples of the method steps B described here and also the further examples in accordance with the general part can also be employed in combination or successively for individual layers to be activated and also for a plurality of layers to be activated within a semiconductor layer sequence.

If necessary, method step B can be followed by further, known method steps for completing the semiconductor chip with a now activated semiconductor layer sequence.

Our methods and chips are not restricted to the examples by the description on the basis thereof. Moreover, this disclosure encompasses any novel feature and also any combination of features, which in particular includes any combination of features in the appended claims, even if the feature or combination itself is not explicitly specified in the claims or examples.

The invention claimed is:

1. A method for producing an optoelectronic semiconductor chip comprising:
   A) forming a semiconductor layer sequence having at least one doped functional layer which comprises bonding complexes with at least one dopant and at least one codopant, wherein one selected from the dopant and the codopant is an electron acceptor and the other an electron donor; and
   B) activating the dopant by breaking open the bonding complexes by introducing energy, wherein the codopant at least partly remains in the semiconductor layer sequence and at least partly forms no bonding complexes with the dopant.

2. The method according to claim 1, wherein the semiconductor layer sequence is formed in step A such that the doped functional layer is arranged between two further functional layers.

3. The method according to claim 1, wherein in step A, the semiconductor layer sequence is completed in a wafer assemblage and subsequently singulated.

4. The method according to claim 1, wherein the dopant comprises magnesium and the codopant comprises hydrogen.

5. The method according to claim 1, wherein in step B, the energy is introduced by generating a current in the doped functional layer.

6. The method according to claim 5, wherein the current is generated contactlessly by induction.

7. The method according to claim 5, wherein the current is effected by the at least one doped functional layer being electrically connected to an external current source.

8. The method according to claim 5, wherein thermal energy is supplied in addition to generation of the current.

9. The method according to claim 8, wherein the thermal energy is at least partly supplied by the current.

10. The method according to claim 1, wherein in step B, the energy is introduced by inwardly radiated electromagnetic radiation.

11. The method according to claim 10, wherein the electromagnetic radiation is at least partly resonant with an absorption wavelength of the doped functional layer.

12. The method according to claim 10, wherein the electromagnetic radiation is at least partly non-resonant with an absorption wavelength of the doped functional layer.

13. An optoelectronic semiconductor chip comprising a semiconductor layer sequence having at least one doped functional layer having at least one dopant and at least one codopant, wherein:
   the semiconductor layer sequence comprises a semiconductor material having a lattice structure;
   one selected from the dopant and the codopant is an electron acceptor and the other an electron donor;
   the codopant is bonded to the semiconductor material and/or arranged at interstitial sites; and
   the codopant at least partly forms no bonding complexes with the dopant.

14. The semiconductor chip according to claim 13, wherein the doped functional layer is arranged between two further functional layers.

15. The semiconductor chip according to claim 13, wherein the dopant comprises magnesium and the codopant comprises hydrogen.

16. The semiconductor chip according to claim 14, wherein the dopant comprises magnesium and the codopant comprises hydrogen.

17. The method according to claim 2, wherein in step A, the semiconductor layer sequence is completed in a wafer assemblage and subsequently singulated.

18. The method according to claim 6, wherein thermal energy is supplied in addition to generation of the current.

19. The method according to claim 7, wherein thermal energy is supplied in addition to generation of the current.

20. The method according to claim 11, wherein the electromagnetic radiation is at least partly non-resonant with an absorption wavelength of the doped functional layer.

* * * * *